United States Patent [19]
Wang

[11] Patent Number: 6,087,243
[45] Date of Patent: Jul. 11, 2000

[54] METHOD OF FORMING TRENCH ISOLATION WITH HIGH INTEGRITY, ULTRA THIN GATE OXIDE

[75] Inventor: Larry Yu Wang, San Jose, Calif.

[73] Assignee: Advanced Micro Devices, Inc., Sunnyvale, Calif.

[21] Appl. No.: 08/955,449

[22] Filed: Oct. 21, 1997

[51] Int. Cl.$^7$ .................................................. H01L 21/762
[52] U.S. Cl. .......................... 438/424; 438/426; 438/435; 438/911
[58] Field of Search .................................... 438/424, 426, 438/435, FOR 227, 974, 911, FOR 496

[56]         References Cited
           U.S. PATENT DOCUMENTS

| | | |
|---|---|---|
| 4,954,459 | 9/1990 | Avanzino et al. . |
| 5,316,965 | 5/1994 | Philipossian et al. . |
| 5,447,884 | 9/1995 | Fahey et al. . |
| 5,516,721 | 5/1996 | Galli et al. . |
| 5,786,262 | 7/1998 | Jang et al. . |
| 5,811,346 | 9/1998 | Sur et al. . |
| 5,885,883 | 3/1999 | Park et al. . |
| 5,895,254 | 4/1999 | Huang et al. . |

*Primary Examiner*—George Fourson

[57]            ABSTRACT

The quality of an ultra thin gate oxide film, particularly at the edges of a shallow trench isolation structure, is improved employing a double sacrificial oxide technique. After trench filling and planarization, the pad oxide layer thickness is increased during trench fill densification in an oxidizing atmosphere. The pad oxide is then removed exposing the substrate surface and trench edges. A second sacrificial oxide is formed consuming part of the substrate surface. The second sacrificial oxide is then removed along with defects in the substrate surface prior to gate oxide and gate electrode formation.

17 Claims, 4 Drawing Sheets

METHOD OF FORMING TRENCH ISOLATION WITH HIGH INTEGRITY, ULTRA THIN GATE OXIDE

TECHNICAL FIELD

The present invention relates to a method of manufacturing a semiconductor device comprising trench isolation. The invention has particular applicability in manufacturing very large scale integration and high density semiconductor devices with submicron design features and active regions isolated by shallow insulated trenches.

BACKGROUND ART

The escalating requirements for high densification and performance associated with ultra large scale integration semiconductor devices requires design features of $0.375\mu$ and under, such as $0.25\mu$ and under, increased transistor and circuit speeds, high reliability and increased manufacturing throughput for competitiveness. The reduction of design features to $0.357\mu$ and under generates numerous problems challenging the limitations of conventional semiconductor manufacturing technology.

Conventional semiconductor devices comprise a substrate and various electrically isolated regions, or so called active regions, in which individual circuit components are formed. The electrical isolation of these active regions is typically accomplished by thermal oxidation of the semiconductor substrate, typically monocrystalline silicon or an epitaxial layer formed thereon, bounding the active regions. The conventional method for forming a field oxide comprises growing or depositing an oxide layer on a semiconductor substrate and depositing a nitride layer thereon. The oxide and nitride layers are patterned employing conventional photolithographic and etching techniques to form a masking layer having openings extending down to and exposing the underlying substrate. The openings define areas on the surface of the substrate in which field oxide regions are subsequently formed. These exposed regions are commonly referred to as the "field."

The field oxide regions are formed by heating the substrate with the field regions exposed to an oxidizing gas, such as oxygen, i.e., a technique known as Local Oxidation of Silicon (LOCOS). Often, an ion implantation step is performed prior to oxidation to ensure the proper functioning of the individually isolated circuit elements in the active regions. Subsequent to oxidation, the nitride layer is removed by some combination of chemical and/or physical etching. LOCOS methodology disadvantageously results in the formation of a field oxide region having edges which taper in its vertical dimension both above and below the original surface of the semiconductor substrate. This tapering end portion resembles and, therefore, is commonly referred to as, a "bird's beak." The bird's beak is formed during the thermal oxidation of the field regions because the oxygen which diffuses vertically into the substrates in the open areas also diffuses horizontally once it has penetrated the substrate.

LOCOS methodology is attendant with several inherent problems. For example, while the horizontal extent of the bird's beak can be loosely controlled by the stress induced in the masking layers adjacent to the field, this same stress can cause strain defects in the active areas including point defects, dislocations, stacking faults, as well as catastrophic failures such as delamination, particle generation, etc. In addition, the extent to which stress/encroachment can be controlled is dependent upon the initial thickness and intrinsic/extrinsic stress condition of the masking layers. Thus the system is complicated and difficult to control with high uniformity. Moreover, the aggressive scaling of gate electrode dimensions into the deep submicron regime, such as less than about $0.375\ \mu$, requires tighter source/drain region to source/drain region spacing which is adversely affected by the bird's beak attendant upon LOCOS methodology.

Another type of isolation structure is known as trench isolation. A trench isolation structure is quite distinct from a field oxide region in structure and the manner in which it is formed. Typically, a pad oxide layer, e.g., silicon dioxide, is formed on a surface of a semiconductor substrate or on a surface of an epitaxial layer formed on the semiconductor substrate. A nitride layer, such as silicon nitride, is formed on the pad oxide layer and a mask is provided on the nitride layer having an opening therein. Anisotropic etching is then conducted to remove portions of the underlying nitride and pad oxide layers and form a trench in the substrate or epitaxial layer, which trench has edges at the surface of the substrate or epitaxial layer. After trench formation, an oxide liner is typically thermally grown in the trench and on the trench edges to control the silicon-silicon dioxide interface quality. The trench is then refilled with an insulating material, such as silicon dioxide derived from tetraethyl orthosilicate (TEOS) and deposited by low pressure chemical vapor deposition (LPCVD). The surface is then planarized, as by chemical-mechanical polishing (CMP), to complete the trench isolation structure. Subsequent to CMP, the silicon nitride layer is removed. Typically, a retrograde well structure is formed by ion implantation with subsequent heating to densify the TEOS derived oxide trench fill and to activate the retrograde well implants. Such a densification-activation heating step is generally conducted at about 900° C. to about 1,100° C. for about 2 hours to about 3 hours.

The remaining portion of the pad oxide layer is then removed with dilute hydrofluoric acid (HF), followed by an industrial standard "RCA" clean. A high quality gate oxide having a thickness of about 30 Å to about 50 Å is grown followed by polysilicon deposition. The weakest part of the gate oxide is at the trench edges. Moreover, defects in the underlying surface appear to concentrate in clusters at the trench edges. Disadvantageous parasitic transistors are formed at the trench edges. Such parasitic edge transistors turn on at a lower voltage than the active device, thereby causing a phenomenon characterized as a "subthreshold kink" in the current-voltage (I–V) characteristic curve of the transistor. Moreover, the gate oxide layer is disadvantageously thinned at the trench edges, with an attendant increase in the electric field strength at the trench edges and decrease in device reliability. As the design rule shrinks to $0.375\mu$ and under, particularly to $0.25\mu$ and under, the adverse consequences of trench edges are exacerbated.

There exists a continuing need for shallow trench isolation methodology, wherein the resulting gate oxide layer at the trench edges exhibits high reliability. There exists a particular continuing need for shallow trench isolation methodology for semiconductor devices having a design rule of about $0.375\mu$ and under, wherein an ultra thin gate oxide having high integrity is formed at the trench edges.

DISCLOSURE OF THE INVENTION

An object of the present invention is a method of manufacturing a semiconductor device having a shallow trench isolation region and a gate oxide with high integrity at the trench edges.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an active region isolated by an insulated trench, which method comprises: forming a first oxide layer, having a first thickness, on a main surface of a semiconductor substrate or on a main surface of an epitaxial layer formed on the semiconductor substrate; depositing a silicon nitride layer on the first oxide layer; forming a trench in the semiconductor substrate or epitaxial layer, wherein the trench has edges at the main surface; growing an oxide liner in the trench; filling the trench with insulating material; planarizing the main surface to expose the silicon nitride layer; removing the silicon nitride layer; heating at a first temperature for a first period of time, to densify the insulating material filling the trench; removing the first oxide layer, thereby exposing the main surface and the trench edges; heating in an oxidizing atmosphere, at a second temperature for a second period of time, to form a second oxide layer having a third thickness on the main surface and the trench edges; removing the second oxide layer, exposing the main surface and the trench edges; forming a gate oxide layer on the main surface and the trench edges; forming a conductive layer on the gate oxide layer; and patterning to form a gate electrode.

Another aspect of the present invention is a method of manufacturing a semiconductor device having an active region isolated by an insulated trench, which method comprises: forming a first oxide layer, having a first thickness, on a main surface of a semiconductor substrate or on a main surface of an epitaxial layer formed on the semiconductor substrate; forming a nitride layer on the first oxide layer; etching through the nitride layer and first oxide layer to form a trench in the semiconductor substrate or epitaxial layer, wherein the trench has edges at the main surface; thermally growing an oxide liner in the trench; filling the trench with silicon oxide derived from tetraethyl orthosilicate deposited by low pressure chemical vapor deposition; planarizing the main surface by chemical-mechanical polishing; removing the nitride layer; ion implanting impurities to form retrograde well implants; heating at a first temperature for a first period of time, to densify the silicon dioxide filling the trench and activate the retrograde well implants; cleaning the main surface; etching, employing aqueous hydrofluoric acid, to remove the first oxide layer exposing the main surface and the trench edges; heating in an oxidizing atmosphere, at a second temperature less than the first temperature and for a second period of time less than the first period of time, to form a second oxide layer having a third thickness less than the second thickness on the main surface and the trench edges; cleaning the main surface; etching, employing aqueous hydrofluoric acid, to remove the second oxide layer exposing the main surface and the trench edges; forming a gate oxide layer on the main surface and the trench edges by thermal oxidation or chemical vapor deposition; forming a layer of doped polycrystalline silicon on the gate oxide layer; and etching to form a gate electrode.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1A:
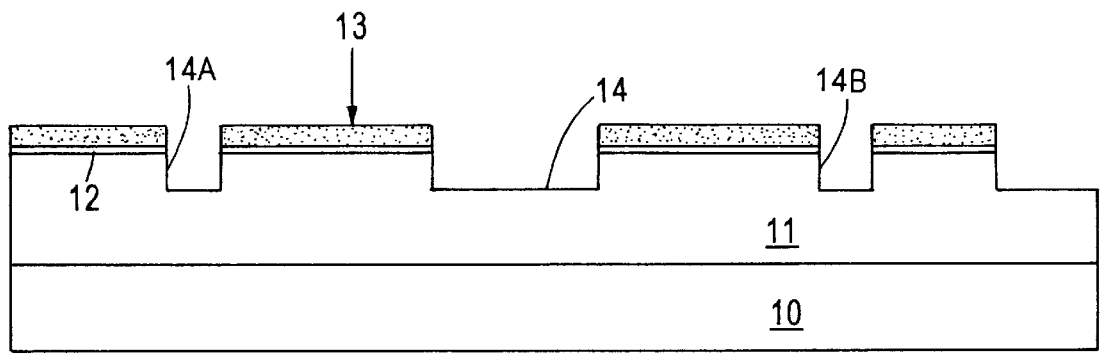
FIGS. 1A through 1H represent sequential phases of a method in accordance with an embodiment of the present invention.

The present invention addresses and solves the problems attendant upon conventional methodology in forming a thin gate oxide layer with low integrity, particularly in semiconductor devices having a design rule of about $0.375\mu$ and under having an ultra thin gate oxide layer at the edges of a shallow isolation trench structure. An initial attempt at improving gate oxide quality at trench edges involved bleeding oxygen into the atmosphere during heating to densify the insulating trench fill and activate the retrograde well implants. As a result, the pad oxide increased in thickness to about 200 Å to about 500 Å. During oxidation, a portion of the underlying silicon surface at the main surface is consumed. Subsequently, the main surface was cleaned of debris and the pad oxide removed, as by etching with aqueous HF. The removed thickened pad oxide layer is referred to as a sacrificial oxide layer. Subsequently, the surface was reoxidized to form the gate oxide layer, and a layer of polycrystalline silicon deposited thereon and patterned to form a gate electrode. Ion implantation was then conducted to form the source/drain regions and dope the polysilicon. This is then followed by conventional processing. It was found, however, that the sacrificial oxide procedure was not sufficient to ensure robust shallow trench edges and formation of a reliable thin gate oxide with high integrity.

After further extensive research and experimentation, it was found that the formation and removal of a second sacrificial oxide dramatically improved gate oxide quality, particularly at the trench edges. Thus, in accordance with the present invention, the previously mentioned sacrificial oxide layer is removed with HF, followed by formation and removal of a second sacrificial oxide layer prior to gate oxide layer formation. In an embodiment of the present invention, the second sacrificial oxide layer is formed by heating at a temperature lower, and for a period of time less, than the temperature and time of heating to densify the insulating trench fill, typically TEOS derived silicon dioxide.

In accordance with an embodiment of the present invention, oxygen is bled into the atmosphere during heating to densify the TEOS derived oxide trench fill and activate the retrograde implant, thereby increasing the pad oxide layer to a thickness of about 200 Å to about 500 Å, preferably about 300 Å. The densification of TEOS in this operation is significant as it allows the densified TEOS to withstand attack by HF during subsequent processing. It is possible to perform this step without the use of oxygen, in which case the oxide thickness will be the original pad oxide thickness of about 150 Å. In accordance with the present invention, the first sacrificial oxide layer is removed, as by etching with dilute HF followed by a surface cleaning treatment commonly referred to as the "RCA" clean, as with a mixture of hydrogen peroxide and ammonium hydroxide, or a mixture of hydrogen peroxide and hydrogen chlorite. After removing the first sacrificial oxide layer, heating is conducted, preferably at a lower temperature and for a shorter period of time than the temperature and time employed to effect densification of the oxide trench fill. For example, the heat treatment to densify the oxide trench fill and activate the retrograde well implants is typically conducted at a temperature about 900° C. to about 1,100° C. for about 2 hours to about 3 hours; whereas, heating to reoxidize the main surface and form the second sacrificial oxide in accordance with the present invention is typically conducted at a lower temperature of about 800° C. to about 1,000° C. for about 2 minutes to about 10 minutes. Manifestly, the higher the temperature employed, the shorter the amount of time required. The second sacrificial oxide layer of the present invention typically has a thickness of about 100 Å to about 300 Å, e.g., about 200 Å.

Further in accordance with the present invention, the second sacrificial oxide is removed, as by etching employing a dilute HF dip followed by the standard "RCA" clean. Since oxidation consumes a portion of the underlying silicon surface, removing the entire second sacrificial oxide layer will expose a fresh silicon surface. A thin gate oxide layer is formed on this fresh silicon surface, as by heating or chemical vapor deposition (CVD) and a conductive layer formed thereon, e.g., polycrystalline silicon. Employing a mask, the conductive layer is patterned to form a gate electrode. Source/drain implants are then conducted and processing resumes in a conventional manner.

It was found that the formation and removal of a second sacrificial oxide layer dramatically improves gate oxide quality, particularly at the trench edges. The exact mechanism underlying the dramatic improvement in gate oxide quality attendant upon formation and removal of a second sacrificial oxide layer is not known with certainty. However, it is believed that poor gate oxide quality, particularly trench edges, stems, at least in part, from defects generated during prior processing in the underlying silicon at the main surface, such as stress formation during deposition of the pad oxide layer and silicon nitride layer. Such defects appear to cluster at the trench edges. It is believed that the formation and removal of a single sacrificial oxide does not expose sufficient "fresh" silicon, i.e., silicon substantially free of defects which adversely impact the gate oxide subsequently formed thereon. However, it is believed that the formation and removal of a second sacrificial oxide in accordance with the present invention results in the exposure of sufficient fresh silicon which is substantially free from harmful defects, thereby resulting in a significant improvement in gate oxide quality, particularly at the trench edges.

Laboratory testing confirmed that the present invention involving the formation and removal of two sequential sacrificial oxide layers resulted in a dramatic improvement in gate oxide quality and virtually eliminated oxide breakdown in low and medium field on tight active stripes. It was found that the primary high field breakdown increased by about 1 MV/cm and the breakdown current density increased by a factor of about 2 to about 4. Testing also revealed that the medium Qbd (total charge to breakdown) values improved by an order of magnitude.

Additional experimentation surprisingly revealed that the formation of a single thicker sacrificial oxide film, e.g., about 400 Å, vis-à-vis 200 Å, was not effective in improving gate oxide quality and actually resulted in a negative impact.

Further experimental testing revealed that an extended pre-gate aqueous HF acid dip degraded gate oxide quality when forming and removing a single sacrificial oxide; however, the longer pre-gate aqueous HF acid dip (600 Å vis-à-vis 375 Å) did not have any significant impact on the double sacrificial oxide regime of the present invention. Thus, it was unexpectedly found that the double sacrificial oxide procedure is substantially insensitive to the pre-gate oxide HF acid dip. Further experimentation revealed that the double sacrificial oxide regime does not negatively impact gate oxide quality of area structures that do not have the shallow trench insulation edges.

An embodiment of the present invention is schematically illustrated in FIGS. 1A through 1H, wherein similar elements bear similar reference numerals. Adverting to FIG. 1A, a substrate 10, typically doped monocrystalline silicon, with an epitaxial layer 11 thereon, is prepared in a conventional manner. The main surface of epitaxial layer 11 is substantially planar. A pad oxide layer 12 is then formed on the main surface. Pad oxide layer 12 is typically silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer.

Subsequently, a nitride layer 13 is deposited on silicon oxide pad layer 12, such as a silicon nitride layer by CVD. Silicon oxide pad layer 12 functions as a buffer layer cushioning stresses between epitaxial layer 11 and silicon nitride layer 13. Silicon nitride layer 13 functions as an oxidation mask as it is resistant to the diffusion of oxygen and water vapor therethrough, thereby preventing an oxidizing species from reaching the underlying silicon substrate. It also acts as a stop layer for the subsequent CMP.

A photoresist mask (not shown) is then formed on silicon nitride layer 13 having a pattern defined by an opening which has a width substantially corresponding to the width of the subsequently formed trench. Anisotropic etching is then conducted to form trench 14 having an internal surface defined, in part, by side surfaces which are substantially vertically aligned with the side surfaces of silicon oxide pad layer 12 and side surfaces of silicon nitride layer 13. the photoresist mask is then removed.

Figure 1B:
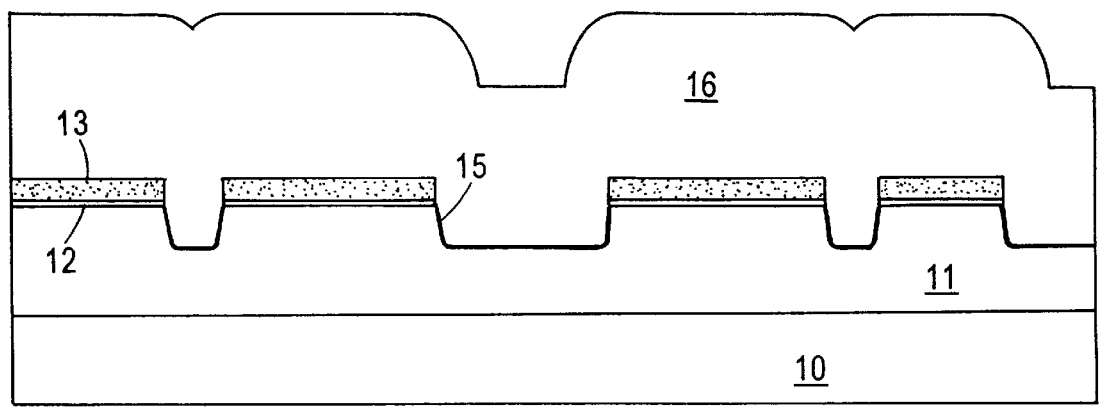
Figure 1C:
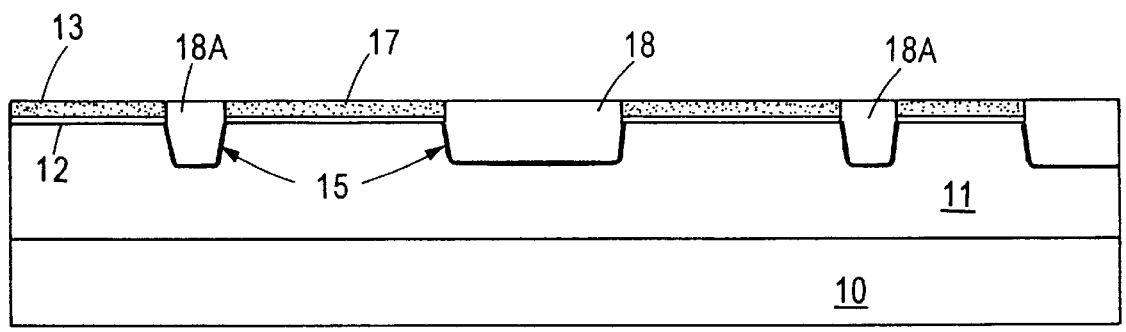
Figure 1D:
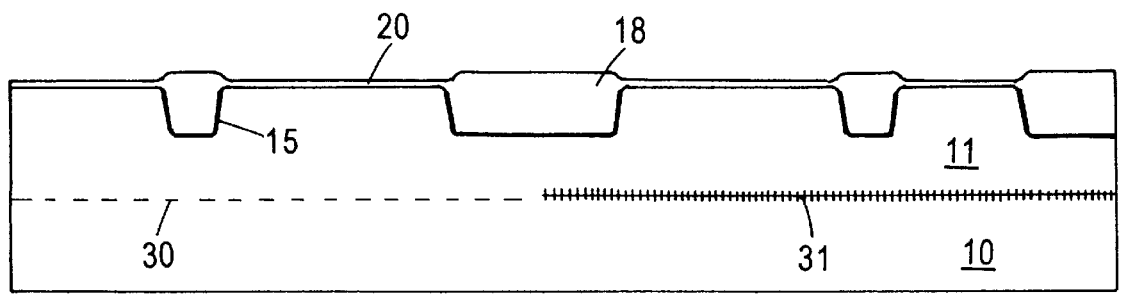

Thermal oxidation is then conducted to form oxide liner 15, as shown in FIG. 1B, typically at a temperature of about 1,000° C. or higher. An oxide 16 is then deposited, such as silicon dioxide derived from TEOS by LPCVD. Planarization is then implemented, as by CMP, to provide a planarized surface 17 with field oxide region 18 and trenches filled with oxide 18A. The planarization technique is preferably the technique disclosed in U.S. Pat. No. 4,954,459, the entire disclosure of which is incorporated herein by reference. Silicon nitride layer 13 is then removed leaving a pad oxide layer of about 100 Å to about 300 Å, typically about 150 Å. Retrograde well implants are then formed, as by ion implantation. Heating is then conducted at a first temperature of about 900° C. to about 1,100° C. for a first period of time, typically about 2 hours to about 3 hours, during which the oxide trench fill is densified and the retrograde implants activated to form retrograde wells 30 and 31, as shown in FIG. 1D. In an embodiment, oxygen is bled into the atmosphere during, thereby increasing the thickness of the pad oxide layer to a thickness of about 200 Å to about 500 Å, e.g., about 300 Å, forming first sacrificial oxide layer 20 (FIG. 1D). In another embodiment, oxygen is not employed, in which case there is no increase in the thickness of the pad oxide layer.

The first sacrificial oxide layer 20 is removed, as by etching with dilute HF, e.g., at a dilution ratio of 100:1 (water:HF). The main surface is then cleaned, as by employing the standard "RCA" clean.

Figure 1E:
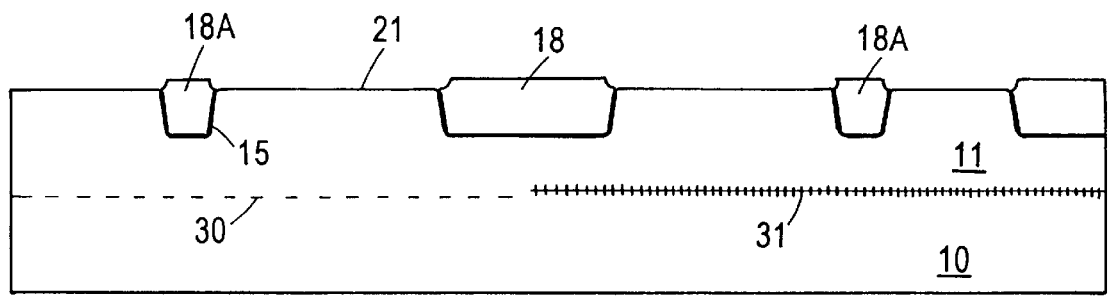
Figure 1F:
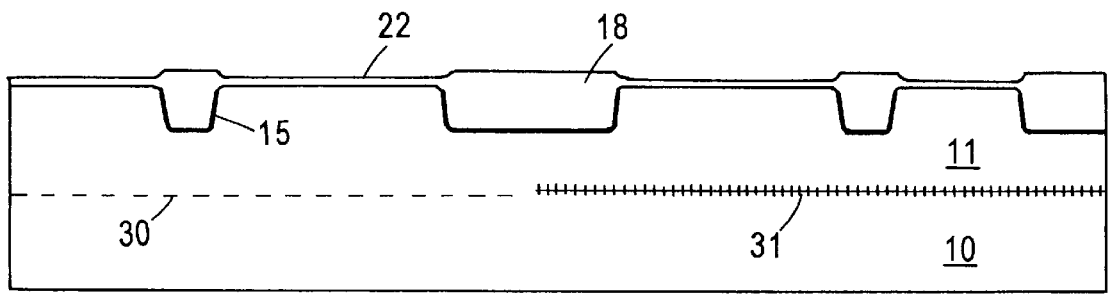
Figure 1G:
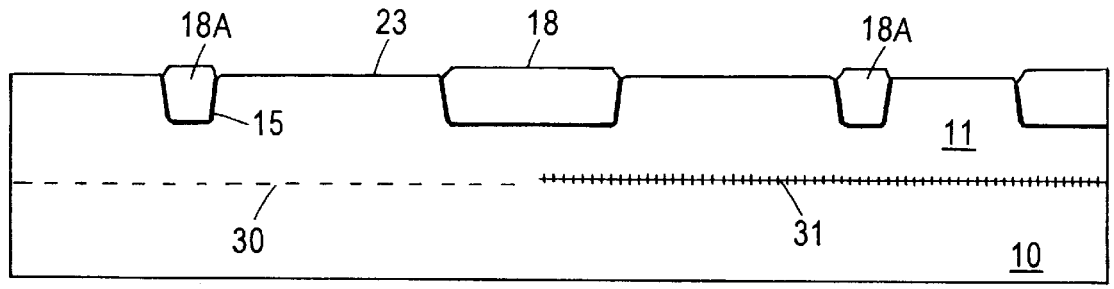

After removing first sacrificial oxide layer 20 silicon on the underlying main surface 21 is exposed as shown in FIG. 1E. A second sacrificial oxide layer 22 is then formed by heating in an oxygen-containing environment at a second temperature less than the first temperature for a second period of time less than the time employed for densification of the oxide trench fill and retrograde implant activation. The second sacrificial oxide layer 22 (FIG. 1F) is typically formed by heating at a temperature of about 800° C. to about 1,000° C. for about 2 minutes to about 10 minutes, typically resulting in a second sacrificial oxide 22 thickness of about 100 Å to about 300 Å, e.g., 200 Å.

Figure 1H:
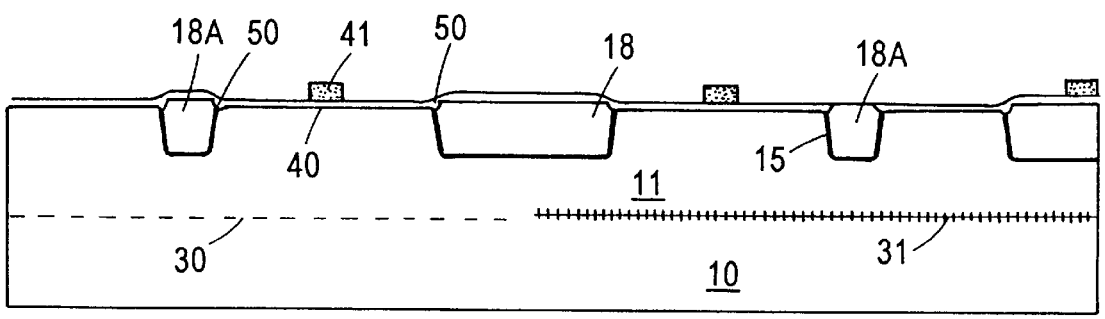

In accordance with the present invention, the second sacrificial oxide layer 22 is then removed, as by etching in an aqueous HF dip, followed by the "RCA" clean. During removal of second sacrificial oxide layer 22, additional silicon at the underlying main surface 23 (FIG. 1G) is removed, thereby exposing fresh silicon with substantially no defects which adversely impact gate oxide integrity. After removing second sacrificial oxide layer 22, a thin gate oxide layer 40 is grown and a conductive material, such as polycrystalline silicon, is deposited and patterned to form gate electrode 41 (FIG. 1H). Subsequent processing is then conducted in a conventional manner as, for example, by forming source/drain implants and thermal activation.

The gate oxide layer 41, formed in accordance with the present invention, typically has a thickness of about 30 Å to 50 Å and exhibits dramatically improved reliability, particularly at trench edges 50 (FIG. 1H). The plural sacrificial oxide technique of the present invention provides dramatically improved results in terms of gate oxide quality, particularly at the trench edges, vis-à-vis a single sacrificial oxide technique. Virtual elimination of the low and medium breakdown distribution on the tight active stripes is achieved, the primary breakdown field is increased by about 1 MB/cm, and the breakdown current density is increased by a factor of about 2 to about 4.

The trench isolation formed in accordance with the present invention is characterized by suppressed formation of parasitic edge transistors at the isolation trench edges. Gate oxide layers at the trench edges exhibit high quality with an attendant reduction in the electric field between the gate electrode and the substrate at the trench edges. The subthreshold kink in the I–V characteristic curve of an integrated circuit is also eliminated by the present invention.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices having a design rule less than about 0.375μ, including less than about 0.25μ.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an active region isolated by an insulated trench, which method comprises:

forming a first oxide layer, having a first thickness, on a main surface of a semiconductor substrate or on a main surface of an epitaxial layer formed on the semiconductor substrate;

depositing a silicon nitride layer on the first oxide layer;

forming a trench in the semiconductor substrate or epitaxial layer, wherein the trench has edges at the main surface;

growing an oxide liner in the trench;

filling the trench with insulating material;

planarizing the main surface to expose the silicon nitride layer;

removing the silicon nitride layer;

heating at a first temperature for a first period of time, to densify the insulating material filling the trench;

removing the first oxide layer, thereby exposing the main surface and the trench edges;

heating in an oxidizing atmosphere, at a second temperature for a second period of time, to form a second oxide layer having a third thickness on the main surface and the trench edges;

removing the second oxide layer, exposing the main surface and the trench edges;

forming a gate oxide layer on the main surface and the trench edges;

forming a conductive layer on the gate oxide layer; and patterning to form a gate electrode, wherein the thickness of the first oxide layer is increased to a second thickness during heating at a first temperature for a first period of time by providing an oxidizing atmosphere.

2. The method according to claim 1, wherein:

the third thickness is less than the second thickness;

the second temperature is less than the first temperature; and the second time is less than the first time.

3. The method according to claim 2, wherein:

the third thickness is about 100 Å to about 300 Å;

the second thickness is 200 Å to about 500 Å;

the second temperature is about 800° C. to about 1,000° C.;

the second time is about 2 minutes to about 10 minutes;

the first temperature is about 900° C. to about 1,100° C.; and the first time is about 2 hours to about 3 hours.

4. The method according to claim 3, wherein the first thickness is about 100 Å to about 300 Å.

5. The method according to claim 2, wherein the insulating material comprises silicon dioxide derived from tetraethyl orthosilicate deposited by low pressure chemical vapor deposition, silicon dioxide derived from silane deposited by low pressure chemical vapor deposition, or a high density plasma oxide.

6. The method according to claim 5, wherein the insulating material comprises silicon dioxide derived from tetraethyl orthosilicate deposited by low pressure chemical vapor deposition.

7. The method according to claim 2, comprising removing the first and second oxide layers by etching.

8. The method according to claim 7, comprising etching using hydrofluoric acid.

9. The method according to claim 2, further comprising ion implanting impurities to form retrograde well implants after planarizing, wherein heating at the first temperature effects activation of the retrograde well implants.

10. The method according to claim 7, comprising cleaning the main surface prior to etching the first and second oxide layers.

11. The method according to claim 10, comprising cleaning using hydrogen peroxide or hydrogen peroxide and ammonium hydroxide.

12. The method according to claim 2, wherein the conductive layer comprises doped polycrystalline silicon.

13. The method according to claim 2, further comprising ion implanting impurities to form source/drain regions.

14. The method according to claim 2, comprising forming the gate oxide layer by thermal oxidation or chemical vapor deposition.

15. The method according to claim 1, further comprising:
forming a nitride layer on the first oxide layer before forming the trench; and
removing the nitride layer after planarizing the main surface.

16. A method of manufacturing a semiconductor device having an active region isolated; by an insulated trench which method comprises:
forming a first oxide layer, having a first thickness, on a main surface of a semiconductor substrate or on a main surface of an epitaxial layer formed on the semiconductor substrate;
forming a nitride layer on the first oxide layer;
etching through the nitride layer and first oxide layer to form a trench in the semiconductor substrate or epitaxial layer, wherein the trench has edges at the main surface;
thermally growing an oxide liner in the trench;
filling the trench with silicon oxide derived from tetraethyl orthosilicate deposited by low pressure chemical vapor deposition;
planarizing the main surface by chemical-mechanical polishing;
removing the nitride layer;
ion implanting impurities to form retrograde well implants;
heating at a first temperature for a first period of time, to densify the silicon dioxide filling the trench and to activate the retrograde well implants;
cleaning the main surface;
etching, using aqueous hydrofluoric acid, to remove the first oxide layer exposing the main surface and the trench edges;
heating in an oxidizing atmosphere, at a second temperature less than the first temperature and for a second period of time less than the first period of time, to form a second oxide layer having a third thickness less than the second thickness on the main surface and the trench edges;
cleaning the main surface;
etching, employing aqueous hydrofluoric acid, to remove the second oxide layer exposing the main surface and the trench edges;
forming a gate oxide layer on the main surface and the trench edges by thermal oxidation or chemical vapor deposition;
forming a layer of doped polycrystalline silicon on the gate oxide layer; and
etching to form a gate electrode, wherein the thickness of the first oxide layer is increased to a second thickness during heating at the first temperature for the first period of time by providing an oxidizing environment.

17. The method according to claim 16, wherein:
the third thickness about 100 Å to about 300 Å;
the second thickness is about 200 Å to about 500 Å;
the second temperature is about 800° C. to about 1,000° C.;
the second time is about 2 minutes to about 10 minutes;
the first temperature is about is about 900° C. to about 1,100° C.; and
the first time is about 2 hours to about 3 hours.

* * * * *